United States Patent
Wu et al.

(10) Patent No.: US 9,654,091 B2
(45) Date of Patent: May 16, 2017

(54) RAIL-TO-RAIL COMPARATOR WITH BUILT-IN CONSTANT HYSTERESIS

(71) Applicant: FREESCALE SEMICONDUCTOR, INC., Austin, TX (US)

(72) Inventors: Jianzhou Wu, Suzhou (CN); Jie Jin, Suzhou (CN); Yikun Mo, Suzhou (CN); Yang Wang, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 25 days.

(21) Appl. No.: 14/946,789

(22) Filed: Nov. 20, 2015

(65) Prior Publication Data

US 2016/0373102 A1  Dec. 22, 2016

(51) Int. Cl.
*H03K 5/24* (2006.01)
*H03K 3/0233* (2006.01)
*H03K 5/08* (2006.01)

(52) U.S. Cl.
CPC ....... *H03K 5/2481* (2013.01); *H03K 3/02337* (2013.01); *H03K 5/082* (2013.01)

(58) Field of Classification Search
CPC .. H03K 5/2481; H03K 3/02337; H03K 5/088; H03K 5/082
See application file for complete search history.

(56) References Cited

U.S. PATENT DOCUMENTS

| | | | |
|---|---|---|---|
| 5,587,674 A | 12/1996 | Danstrom | |
| 6,970,022 B1 | 11/2005 | Miller | |
| 7,576,572 B2 | 8/2009 | Ball | |
| 7,907,011 B2* | 3/2011 | Chung | H03F 3/45219 330/255 |
| 8,310,279 B2* | 11/2012 | Sudjian | H03K 3/3565 327/205 |
| 8,558,581 B2* | 10/2013 | Prohaska | H03K 3/02337 327/206 |

* cited by examiner

*Primary Examiner* — Jung Kim
(74) *Attorney, Agent, or Firm* — Charles E. Bergere

(57) ABSTRACT

A comparator has an input stage having (i) resistor-coupled super source-follower circuits that convert differential input voltages into differential currents and (ii) hysteresis current-injection circuits that inject hysteresis currents into the differential currents. An output stage processes the differential currents to control the comparator output. Common-mode (CM) detection circuits inhibit some of the differential currents from reaching the output stage if the CM voltage is too close to a voltage rail of the comparator. The comparator is able to operate at CM voltages over the entire rail-to-rail range with constant hysteresis voltage.

11 Claims, 2 Drawing Sheets

RAIL-TO-RAIL COMPARATOR WITH BUILT-IN CONSTANT HYSTERESIS

BACKGROUND

The present invention relates generally to integrated circuits and, more particularly, to a comparator circuit having hysteresis.

A comparator is a circuit that compares the voltage levels of two input signals and generates an output signal that indicates whether one of the input signals is greater than the other input signal. For example, in some applications, the second input signal is a fixed reference signal, and the comparator generates (i) a high voltage output signal (e.g., corresponding to a logical one value) when the first input signal is greater than the second, reference input signal and (ii) a low voltage output signal (e.g., corresponding to a logical zero value) when the first input signal is not greater than the second, reference input signal.

In some noisy applications, the first input signal and possibly even the second, reference input signal have relatively high frequency voltage fluctuations that can result in chattering where the output signal toggles rapidly between the high and low voltage output levels when the two input signals have similar voltage levels.

To avoid chattering, it is known to design a comparator with built-in hysteresis, where the threshold voltage level required for the output signal to transition from low to high is higher than the threshold voltage level required for the output signal to transition from high to low. For example, in one implementation of hysteresis, if the first input signal was previously substantially less than the second input signal such that the output signal was previously low, then the comparator output will transition from low to high only when the voltage of the first input signal is greater than the voltage of the second input signal by at least a specified first hysteresis voltage difference. Furthermore, if the first input signal was previously substantially greater than the second input signal such that the output signal was previously high, then the comparator output will transition from high to low only when the voltage of the first input signal is less than the voltage of the second input signal by at least a specified second hysteresis voltage difference. In this particular situation, the total hysteresis voltage difference of the comparator is the sum of the first and second hysteresis voltage differences. Note that, in other implementations, only one of the two hysteresis voltage differences is needed to provide hysteresis.

FIG. 1 is a schematic circuit diagram of a conventional comparator 100 having built-in hysteresis. The comparator 100 has an input stage 110, hysteresis current-injection circuitry 120, an output stage 150, a Schmitt trigger circuit 160, and two inverters 170 and 180. The input stage 110 comprises p-type transistors P0-P1, n-type transistors N0-N1, and two constant-current sources I1 and I2. The hysteresis current-injection circuitry 120 includes p-type transistors P2 and P3 and a constant-hysteresis-current source Ihy. The output stage 150 comprises p-type transistors P4-P7 and n-type transistors N4-N7. In one implementation, the p-type transistors in the comparator 100 are all PMOS transistors, and the n-type transistors are all NMOS transistors.

The comparator 100 is a differential comparator that converts a voltage difference INP, INN applied to the differential input pairs P0/P1 and N0/N1 of the input stage 110 into a differential current that is injected into the output stage 150, which causes the Schmitt trigger circuit 160 to fire when the rising current level in one leg of the output stage 150 crosses the falling current level in the other leg of the output stage 150.

The output stage 150 includes a P cascade comprising (i) an upper P gate formed by the transistors P4 and P5 and (ii) an intermediate P gate formed by the transistors P6 and P7. The output stage 150 also includes an N cascade comprising (i) an intermediate N gate formed by the transistors N6 and N7 and (ii) a lower N gate formed by the transistors N4 and N5. The reference signal VPU is the voltage bias for the upper P gate, the reference signal VPM is the voltage bias for the intermediate P gate, and the reference signal VNM is the voltage bias for the medium N gate. Note that bias voltage for the lower N gate of the N cascade is the drain voltage of the transistors P6 and N6.

The comparator 100 is designed such that, for normal operations, the current $I_{P4}$ through the transistor P4 is equal to the current $I_{P5}$ through the transistor P5, which current is also referred to herein as the bias current $I_{BIAS}$. In addition, the current $I_1$ generated by the current source I1 is equal to the current $I_2$ generated by the current source I2, which current is also referred to herein as the tail current $I_{TAIL}$.

In general, the current $I_{N4}$ flowing through the transistor N4 is given by Equation (1) as follows:

$$I_{N4} = I_{P4} + I_{P2} - I_{N0} + I_{P0} \qquad (1)$$

and the current $I_{N5}$ flowing through the transistor N5 is given by Equation (2) as follows:

$$I_{N5} = I_{P5} + I_{P3} - I_{N1} + I_{P1}. \qquad (2)$$

Assume that initially the input signal INP is low (i.e., at or near the ground voltage GND), the complementary input signal INN is high (i.e., at or near the supply voltage VDD), the output signal OUT is low, and the complementary output signal OUTN is high. In that case, the transistor P2 will be on, the transistor P3 will be off, and the hysteresis current Ihy will inject into the drain of the transistor N0. In that case, the current $I_{N4}$ through the transistor N4 will be given by Equation (3) as follows:

$$I_{N4} = I_{P4} + I_{P2} - I_{N0} + I_{P0} = I_{BIAS} + I_{hy} - I_{N0} + I_{P0} \qquad (3)$$

and the current $I_{N5}$ through the transistor N5 will be given by Equation (4) as follows:

$$I_{N5} = I_{P5} + I_{P3} - I_{N1} + I_{P1} = I_{BIAS} - I_{N1} + I_{P1}. \qquad (4)$$

Thus, when the input signal INP is low and the complementary input signal INN is high, $I_{N1} > I_{N0}$, $I_{P0} > I_{P1}$, and the current $I_{N4}$ through the transistor N4 is greater than the current $I_{N5}$ through the transistor N5.

As the input signal INP increases and the complementary input signal INN decreases, the current through the transistor N0 increases, and the current through the transistor N1 decreases. At the same time, the current through the transistor P0 decreases, and the current through the transistor P1 increases. As such, the current $I_{N4}$ through the transistor N4 decreases and the current $I_{N5}$ through the transistor N5 increases.

If and when the falling current $I_{N4}$ through the transistor N4 becomes equal to the rising current $I_{N5}$ through the transistor N5, the output of the Schmitt trigger circuit 160 will switch from low to high, which causes (i) the output signal OUT to go from low to high and (ii) the complementary output signal OUTN to go from high to low, thereby turning off the transistor P2, turning on the transistor P3, and switching the hysteresis current $I_{hy}$ from output leg of the transistor N4 to the output leg of the transistor N5 all at once. The Schmitt trigger circuit 160 is a conventional digital buffer circuit with its own hysteresis voltage, whose function is to depress the influence of noise at the output of the comparator 100.

If the input signal INP continues to increase and the complementary input signal INN continues to decrease, the current $I_{N5}$ through the transistor N5 will become greater than the current $I_{N4}$ through the transistor N4. With the output signal OUT high and the complementary output signal OUTN low, the transistor P2 will be off, the transistor P3 will be on, and the hysteresis current Ihy will inject into the drain of the transistor N1. In that case, the current $I_{N4}$ through the transistor N4 will be given by Equation (5) as follows:

$$I_{N4}=I_{P4}+I_{P2}-I_{N0}+I_{P0}=I_{BIAS}+0-I_{TAIL}+0=I_{BIAS}-I_{N0}+I_{P0} \quad (5)$$

and the current $I_{N5}$ through the transistor N5 will be given by Equation (6) as follows:

$$I_{N5}=I_{P5}+I_{P3}-I_{N1}+I_{P1}=I_{BIAS}+I_{hy}-0+I_{TAIL}=I_{BIAS}+I_{hy}+-I_{N1}+I_{P1}. \quad (6)$$

Thus, when the input signal INP is high and the complementary input signal INN is low, $I_{N0}>I_{N1}$, $I_{P1}>I_{P0}$, and the current $I_{N5}$ through the transistor N5 is greater than the current $I_{N4}$ through the transistor N4.

If and when the input signal INP decreases and the complementary input signal INN increases, the current through the transistor N0 decreases, and the current through the transistor N1 increases. At the same time, the current through the transistor P0 increases, and the current through the transistor P1 decreases. As such, the current $I_{N4}$ through the transistor N4 increases and the current $I_{N5}$ through the transistor N5 decreases.

If and when the rising current $I_{N4}$ through the transistor N4 becomes equal to the falling current $I_{N5}$ through the transistor N5, the output of the Schmitt trigger circuit 160 will switch from high to low, which causes (i) the output signal OUT to go from high to low and (ii) the complementary output signal OUTN to go from low to high, thereby turning on the transistor P2, turning off the transistor P3, and switching the hysteresis current $I_{hy}$ from output leg of the transistor N5 back to the output leg of the transistor N4 all at once.

The Schmitt trigger circuit 160 ensures that either (i) OUT=0 and OUTN=1 or (ii) OUT=1 and OUTN=0. As such, either (i) $I_{P2}=I_{hy}$ and $I_{P3}=0$ or (ii) $I_{P2}=0$ and $I_{P3}=I_{hy}$. In general, when the current $I_{N4}$ through the transistor N4 is equal to the current $I_{N5}$ through the transistor N5, Equations (1) and (2) yield Equation (7) as follows:

$$I_{P4}+I_{P2}-I_{N0}+I_{P0}=I_{P5}+I_{P3}-I_{N1}+I_{P1}. \quad (7)$$

Since $I_{P4}=I_{P5}$, Equation (7) can be rewritten as Equation (8) as follows:

$$|(I_{P1}-I_{P0})+(I_{N0}-I_{N1})|=I_{hy} \quad (8)$$

where the sign depends on which of the two output conditions exist.

The inclusion of the hysteresis current-generation circuitry 120 in the comparator 100 results in the voltage level of the rising input signal INP at which the output signal OUT switches from low to high being higher than the voltage level of the falling input signal INP at which the output signal OUT switches from high to low. This hysteresis voltage difference $\Delta V$ inhibits unwanted chattering in the output signal OUT in noisy environments.

The relationships between the hysteresis voltage difference $\Delta V$ and the differential currents flowing through the two pairs of input transistors P0, P1 and N0, N1 can be expressed by Equations (9) and (10) as follows:

$$g_{mp}*\Delta V=I_{P1}-I_{P0} \quad (9)$$

and $$g_{mn}*\Delta V=I_{N0}-I_{N1}, \quad (10)$$

where $g_{mp}$ is the transconductance of the input pair P0, P1, and $g_{mn}$ is the transconductance of the input pair N0, N1. The total transconductance gm of the comparator 100 is the sum of the transconductances of the two input pairs or $(g_{mp}+g_{mn})$. Substituting Equations (9) and (10) for $g_{mp}$ and $g_{mn}$ and applying Equation (8) yields Equation (11) as follows:

$$\Delta V=I_{hy}/gm. \quad (11)$$

Equation (11) implies that, for a constant-hysteresis-current source Ihy, the hysteresis voltage difference $\Delta V$ will be constant for all operating conditions if the total transconductance gm of the comparator 100 is also constant.

However, the transconductance gm of the comparator 100 is not constant for all common-mode voltage levels Vcm, but is instead given by Equation (12) as follows:

$$gm = \begin{cases} \dfrac{I_D}{\zeta_n * V_T} & Vcm < V_{thn} \\ \dfrac{I_D}{V_T}\left(\dfrac{1}{\zeta_n}+\dfrac{1}{\zeta_p}\right) & V_{thn} \leq Vcm \leq V_{DD} - V_{thp} \\ \dfrac{I_D}{\zeta_p * V_T} & Vcm \geq V_{DD} - V_{thp} \end{cases} \quad (12)$$

where:
  $I_D$ is the current flowing through the drain terminal of an n-type or p-type input MOS transistor (e.g., N0, N1, P0, P1) operating in the weak inversion region. In this case, $I_D=0.5*I_{TAIL}$;
  $V_T$ is the thermal voltage;
  $\zeta_n$ is a factor which stems from a voltage divider between the oxide capacitance Cox and the depletion capacitance Cjsn in an n-type input MOS transistor (e.g., N0, N1), where $$\zeta_n = \frac{Cjsn + Cox}{Cox};$$

$\zeta_p$ is a factor which stems from a voltage divider between the oxide capacitance Cox and the depletion capacitance Cjsn in a p-type input MOS transistor (e.g., P0, P1), where $$\zeta_p = \frac{Cjsp + Cox}{Cox};$$

Vcm is the common-mode voltage, which is equal to (INP+INN)/2;
  Vthn is the threshold voltage for the n-type transistor;
  Vthp is the threshold voltage for the p-type transistor.

When the currents I1 and I2 are equal, then the hysteresis voltage difference $\Delta V$ is given by Equation (13) as follows:

$$\Delta V = kV_T \Big/ \left(\frac{1}{\zeta_n}+\frac{1}{\zeta_p}\right) \quad (13)$$

where k is the ratio $I_{hy}/I_D$.

As shown in Equation (X1), the transconductance gm of the comparator 100 is different for different ranges of the common-mode voltage Vcm. As such, Equation (11) implies that the hysteresis voltage difference ΔV is not constant for all values of the common-mode voltage level Vcm. In particular, when the input pair N0, N1 is operated at subthreshold (i.e., in the weak inversion region of the devices), the comparator 100 suffers transconductance degeneration in which the hysteresis curve increases sharply when the common-mode voltage approaches either the supply voltage VDD or the ground voltage GND. Such non-uniform hysteresis behavior with varying common-mode voltage level is undesirable in certain applications.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, a comparator comprises an input stage, hysteresis current-injection circuitry, and an output stage. The input stage comprises resistor-coupled source-follower circuitry that converts a differential input voltage into differential current independent of operating region of transistors used to implement the source-follow circuitry. The hysteresis current-injection circuitry injects hysteresis current into the differential current generated in the input stage to add hysteresis voltage to operations of the comparator, wherein the hysteresis voltage is independent of the operating region of the transistors used to implement the source-follower circuitry. The output stage processes the differential current provided by the input stage to control an output of the comparator.

Figure 1:
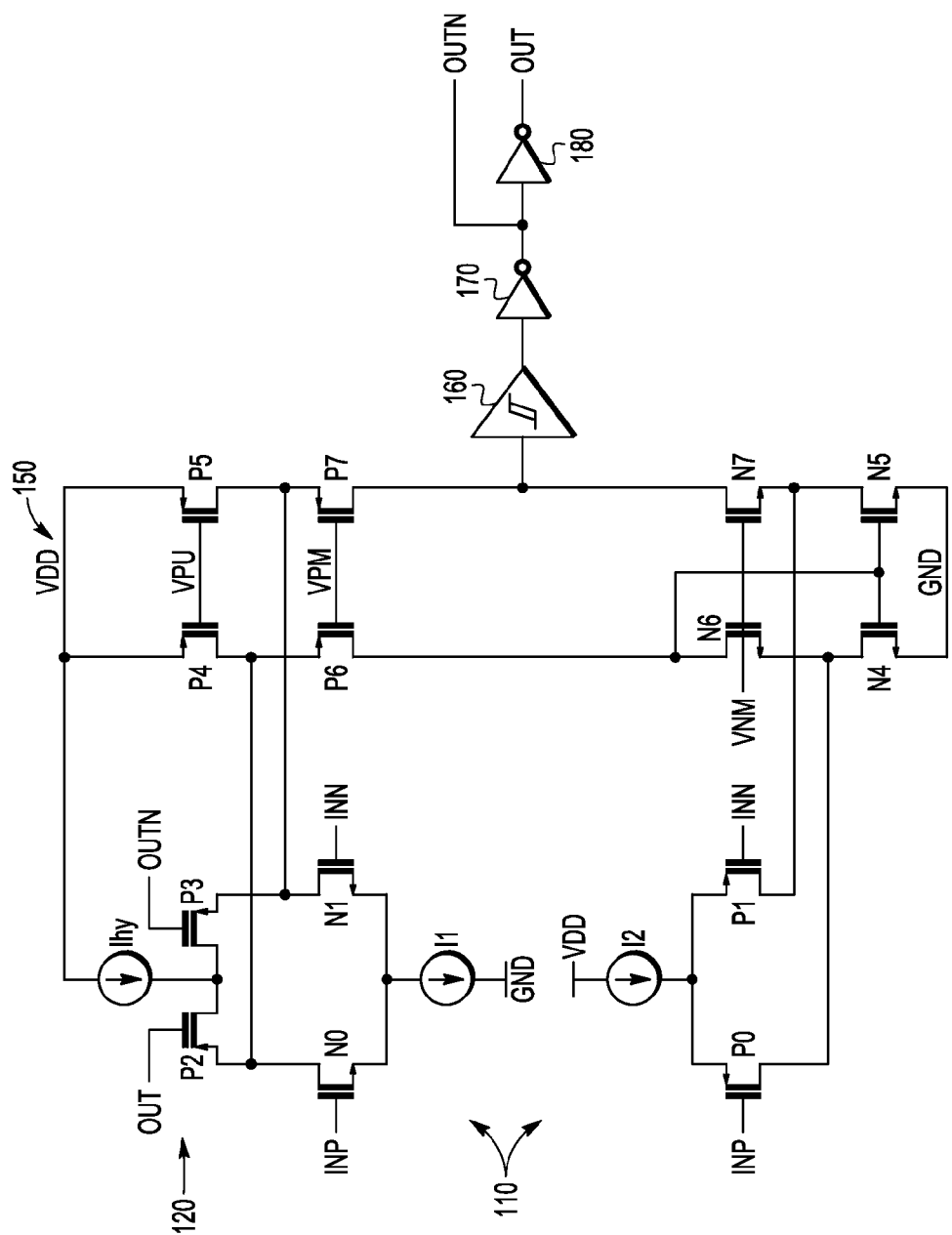
FIG. 1 is a schematic circuit diagram of a conventional comparator having built-in hysteresis.
Figure 2:
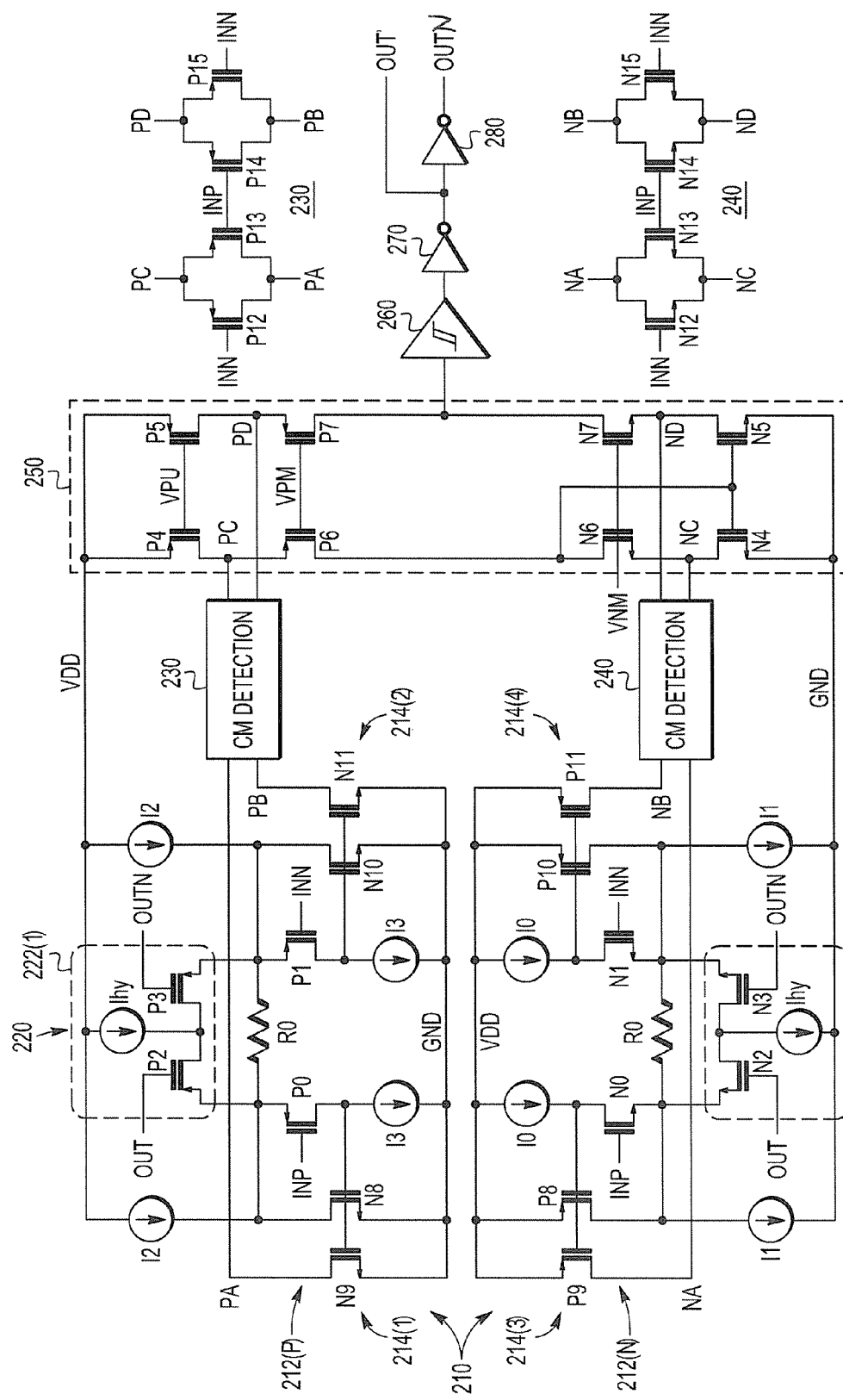
FIG. 2 is a schematic circuit diagram of a comparator having built-in hysteresis according to one embodiment of the invention.

FIG. 2 is a schematic circuit diagram of a comparator 200 having built-in hysteresis, according to one embodiment of the invention. Like the prior-art comparator 100 of FIG. 1, the comparator 200 has an input stage 210, hysteresis current-injection circuitry 220, an output stage 250, a Schmitt trigger circuit 260, and two inverters 270 and 280. In addition, the comparator 200 has two common-mode (CM) detection circuits 230 and 240.

The input stage 210 has four super source-follower (SSF) sub-circuits 214(1)-214(4). The first SSF sub-circuit 214(1) includes a p-type input transistor P0, two n-type current-mirror transistors N8 and N9, and two constant-current sources I2 and I3. The second SSF sub-circuit 214(2) includes a p-type input transistor P1, two n-type current-mirror transistors N10 and N11, and two constant-current sources I2 and I3. The third SSF sub-circuit 214(3) includes an n-type input transistor N0, two p-type current-mirror transistors P8 and P9, and two constant-current sources I0 and I1. The fourth SSF sub-circuit 214(4) includes an n-type input transistor N1, two p-type current-mirror transistors P10 and P11, and two constant-current sources I0 and I1. The first and second SSF sub-circuits 214(1) and 214(2) are coupled at the sources of the transistors P0 and P1 by an upper resistor R0, to form an upper, P side 212(P) of the input stage 210. Similarly, the third and fourth SSF sub-circuits 214(3) and 214(4) are coupled at the sources of the transistors N0 and N1 by a lower resistor R0 having the same resistance as the upper resistor R0, to form a lower, N side 212(N) of the input stage 210.

The hysteresis current-injection circuitry 220 has two hysteresis current-injection (HCI) sub-circuits 222(1) and 222(2). The first HCI sub-circuit 222(1) includes two p-type transistors P2 and P3 and an upper constant-hysteresis-current source Ihy, while the second HCI sub-circuit 222(2) includes two n-type transistors N2 and N3 and a lower constant-hysteresis-current source Ihy.

Referring to the first SSF sub-circuit 214(1), if the voltage applied to the gate of the input transistor P0 is Vinp, then the voltage at the source of the input transistor P0 will be (Vinp+ΔV), where the value of ΔV depends on the current $I_3$ generated by the current device I3. The current flowing through the transistor N8 is $(I_2-I_3)$, and, when the input voltage Vinp changes, the voltage at the source of the input transistor P0 will change by an equivalent amount.

Similarly, for the second SSF sub-circuit 214(2), if the voltage applied to the gate of the input transistor P1 is Vinn, then the voltage at the source of the input transistor P1 will be (Vinn+ΔV). The current flowing through the transistor N10 is $(I_2-I_3)$, and, when the input voltage Vinn changes, the voltage at the source of the input transistor P1 will change by an equivalent amount.

Ignoring, for the time being, the existence of the hysteresis current $I_{hy}$, when Vinp=Vinn=Vcm (i.e., the common-mode voltage), the current flowing through the transistor N8 will be equal to the current flowing through the transistor P10. In that case, the voltage $V_{P0S}$ at the source of the transistor P0 and the voltage $V_{P1S}$ at the source of the transistor P1 will both be equal to (Vcm+ΔV). As such, the voltage difference across the resistor R0 will be zero, no current will flow through the resistor R0 (i.e., $I_{R0}=0$), and the currents flowing through the transistors N8 and N10 will both be $(I_2-I_3)$.

If and when the input voltage Vinp rises above the complementary input voltage Vinn, such that (Vinp- Vinn)=$\Delta V_1$, then the voltage $V_{R0}$ across the resistor R0 will be given by Equation (X1) as follows:

$$V_{R0}=(V_{P0S}-V_{P1S})=\Delta V_1. \quad (X1)$$

In that case, the current $I_{R0}$ flowing through the resistor R0 will be given by Equation (X2) as follows:

$$I_{R0}=\Delta V_1/R_0, \quad (X2)$$

where $R_0$ is the resistance of the resistor R0.

In addition, the currents $I_{N8}$ and $I_{N10}$ flowing through the transistors N8 and N10 will be given by Equations (X3) and (X4), respectively, as follows:

$$I_{N8}=I_2-I_3-I_{R0} \quad (X3)$$

and $$I_{N10}=I_2-I_3+I_{R0}. \quad (X4)$$

These two different currents $I_{N8}$ and $I_{N10}$ are respectively mirrored by the transistors N9 and N11 and applied to the nodes PA and PB of the upper CM detection circuit 230.

In an analogous manner, the third and fourth SSF sub-circuits 214(3) and 214(4), connected by the lower resistor R0 having the same resistance $R_0$ as the upper resistor R0, generate and apply two different currents $I_{P8}$ and $I_{P10}$) to the nodes NA and NB of the lower CM detection circuit 240 respectively given by Equations (X5) and (X6) as follows:

$$I_{P8}=I_0-I_1-I_{R0} \quad (X5)$$

and $$I_{P10}=I_0-I_1+I_{R0}, \quad (X6)$$

where $I_0$ is the current generated by the current source $I_0$, and $I_1$ is the current generated by the current source I1.

In this case, the current flowing through the left leg (as shown in FIG. 2) of the output stage 250 will be greater than the current flowing through the right leg of the output stage 250, and the trigger circuit 260 will cause the output signal OUT to be high and the complementary output signal OUTN to be low.

In an analogous manner, if and when the complementary input voltage Vin rises above the input voltage Vinp, such that (Vinn-Vinp)=$\Delta V_1$, that voltage difference will be converted by each of the upper and lower source-coupling resistors R0 into a current that causes different currents to flow through transistors N8 and N10 and through transistors P8 and P10, which different currents are mirrored by transistors N9 and N11 and by transistors P9 and P11, causing the current flowing through the right leg of the output stage 250 to be greater than the current flowing through the left leg of the output stage 250, such that the trigger circuit 260 will cause the output signal OUT to be low and the complementary output signal OUTN to be high.

From Equations (X3) and (X4), the current differential between the transistors N8 and N10 is given by Equation (X7) as follows:

$$I_{N10}-I_{N8}=2*I_{R0}. \quad (X7)$$

Similarly, from Equations (X5) and (X6), the current differential between the transistors P8 and P10 is given by Equation (X8) as follows:

$$I_{P10}-I_{P8}=2*I_{R0}. \quad (X8)$$

From Equations (X2), (X7), and (X8), the transconductance gm of the input stage 210 is given by Equation (X9) as follows:

$$gm=2/R_0, \quad (X9)$$

which depends only on the resistance of the source-coupling resistors R0 and is independent of the operating region (e.g., saturation region vs. sub-threshold region) of the p-type and n-type transistors in the input stage 210.

So far in this description of the comparator 200 of FIG. 2, the existence of the hysteresis currents $I_{hy}$ has been ignored. At this point, the effects caused by the injection of the hysteresis currents $I_{hy}$ on hysteresis voltage generation will be considered. Assume that the input voltage Vinp was and still is sufficiently greater than the complementary input voltage Vinn such that the output OUT is high (i.e., logic 1). In that case, the transistor P2 will be off and the transistor P3 will be on, such that the hysteresis current $I_{hy}$ will be injected into the source node of the transistor P1. As such, the current $I_{N10}$ flowing through the transistor N10 will be given by Equation (X10) as follows:

$$I_{N10}=I_2-I_3+I_{R0}+I_{hy}. \quad (X10)$$

and, from Equations (X3) and (X10), the current differential between the transistors N8 and N10 is given by Equation (X11) as follows:

$$I_{N10}-I_{N9}=2*I_{R0}+I_{hy}. \quad (X11)$$

If and when the input voltage Vinp goes low and lower than the complementary input voltage Vinn, at some point, the direction of current flowing through the resistor R0 will reverse. As the input voltage Vinp continues going low, at some point, the current $I_{N10}$ flowing through the transistor N10 will be equal to the current $I_{N8}$ flowing through the transistor N8. The differential input voltage $\Delta V_1$ at which the differential current ($I_{N10}-I_{N8}$) is zero is given by Equation (X12) as follows:

$$\Delta V_1=-0.5*I_{hy}*R_0. \quad (X12)$$

If the input voltage Vinp continues going low, then the output OUT will switch from high to low (i.e., logic 0). In that case, the transistor P2 will be on, the transistor P3 will be off, and the hysteresis current $I_{hy}$ will be injected into the source node of the transistor P0.

If and when the input voltage Vinp again goes high and higher than the complementary input voltage Vinn, again the direction of current flowing through the resistor R0 will eventually reverse and again the differential current ($I_{N10}-I_{N8}$) will eventually be zero. In this case, the differential input voltage $\Delta V_1$ at which the differential current ($I_{N10}-I_{N8}$) is zero is given by Equation (X13) as follows:

$$\Delta V_1=0.5*I_{hy}*R_0. \quad (X13)$$

In an analogous manner, it can be shown that Equations (X12) and (X13) apply equally well to the N side 212(N) of the input stage 210. As such, the total hysteresis voltage for the comparator 200 is ($I_{hy}*R_0$), which, like the transconductance of Equation (X9), depends only on the resistance of the source-coupling resistors R0 and is independent of the operating region (e.g., saturation region vs. sub-threshold region) of the p-type and n-type transistors in the input stage 210.

If the common-mode voltage Vcm is greater than (VDD-Vthp), where Vthp is the threshold voltage for the p-type transistors P0 and P1, then the current $I_2$ will be reduced due to the limited voltage headroom. In this case, the first and second SSF sub-circuits 214(1) and 214(2) of the P side 212(P) of the input stage 210 will not function well, and the currents generated by the P side 212(P) will be inappropriate to inject into the output stage 250. The CM detection circuit 230 is provided to inhibit those inappropriate currents from being injected into the output stage 250. In particular, when Vcm is greater than (VDD-Vthp), both Vinp and Vinn will be sufficiently high such that all four p-type transistors P12-P15 of the CM detection circuit 230 will be off, thereby preventing the currents applied at nodes PA and PB from reaching nodes PC and PD. In that case, the operations of the comparator 200 will rely on the third and fourth SSF sub-circuits 214(3) and 214(4) of the N side 212(N) of the input stage 210, which will function well at such high CM-voltage levels.

On the other hand, if the common-mode voltage Vcm is less than the threshold voltage Vthn for the p-type transistors N0 and N1, then the current $I_1$ will be reduced due to the limited voltage headroom. In this case, the third and fourth SSF sub-circuits 214(3) and 214(4) of the N side 212(N) of the input stage 210 will not function well, and the currents generated by the N side 212(N) will be inappropriate to inject into the output stage 250. The CM detection circuit 240 is provided to inhibit those inappropriate currents from being injected into the output stage 250. In particular, when Vcm is less than Vthn, both Vinp and Vinn will be sufficiently low that all four n-type transistors N12-N15 of the CM detection circuit 240 will be off, thereby preventing the currents applied at nodes NA and NB from reaching nodes NC and ND. In that case, the operations of the comparator 200 will rely on the first and second SSF sub-circuits 214(1) and 214(2) of the P side 212(P) of the input stage 210, which will function well at such low CM-voltage levels.

As described above, the operations of the comparator 200 are independent of the operating region of the transistors used to implement the comparator 200. In particular, both the transconductance and the total hysteresis voltage of the comparator 200 are independent of transistor operating region. This means that the comparator 200 will operate with constant hysteresis voltage as the common-mode voltage varies over the entire rail-to-rail range of the comparator 200, with (i) CM voltages from 0 to Vthn being handled by the P side 212(P) of the input stage 210, (ii) CM voltages from (VDD-Vthp) to VDD being handled by the N side 212(N) of the input stage 210, and (iii) CM voltages in between being handled by both sides 212(P) and 212(N) of the input stage 210.

Note that one or both of the CM detection circuits 230 and 240 can be omitted for embodiments that do not operate with full rail-to-rail CM voltage variations. Furthermore, for some embodiments, one of the hysteresis current-injection sub-circuits 222(1) and 222(2) may be omitted.

Although the invention has been described in the context of the comparator 200 having super source-follower circuitry in the input stage 210, in alternative embodiments, comparators can be implemented using regular source-follower circuitry instead of super source-follower circuitry.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A comparator, comprising:
   an input stage comprising resistor-coupled source-follower circuitry that converts a differential input voltage into differential current independent of an operating region of transistors used to implement the source-follower circuitry;

hysteresis current-injection circuitry that injects hysteresis current into the differential current generated in the input stage to add hysteresis voltage to operations of the comparator, wherein the hysteresis voltage is independent of the operating region of the transistors used to implement the source-follower circuitry;

an output stage that processes the differential current provided by the input stage to control an output of the comparator; and a common-mode (CM) detection circuit that inhibits differential current in the input stage from reaching the output stage if a CM voltage of the differential input voltage is substantially close to a voltage rail of the comparator.

2. The comparator of claim 1, wherein the comparator operates with constant hysteresis voltage over a common-mode operating range of the comparator.

3. The comparator of claim 1, wherein the comparator operates with constant transconductance over a common-mode operating range of the comparator.

4. The comparator of claim 1, wherein the CM detection circuit inhibits differential current from the input stage from reaching the output stage if the CM voltage of the differential input voltage is within a transistor threshold voltage of the voltage rail.

5. The comparator of claim 1, wherein:
the input stage comprises:
  a P side comprising a first super source-follower sub-circuit source-coupled by a first resistor to a second super source-follower sub-circuit; and
  a N side comprising a third super source-follower sub-circuit source-coupled by a second resistor to a fourth super source-follower sub-circuit; and
the hysteresis current-injection circuitry comprises:
  a P-side hysteresis current-injection circuit connected to inject a first hysteresis current into the P side of the input stage; and
  an N-side hysteresis current-injection circuit connected to inject a second hysteresis current into the N side of the input stage.

6. The comparator of claim 5, wherein:
the first and second resistors have equivalent resistance levels; and
the first and second hysteresis currents have equivalent current magnitudes.

7. The comparator of claim 6, wherein:
transconductance of the input stage is based on the resistance level of the first and second resistors; and
the hysteresis voltage of the comparator is based on the resistance level of the first and second resistors and the current magnitude of the hysteresis current.

8. The comparator of claim 5, wherein the CM detection circuit comprises:
a first CM detection circuit that inhibits differential current from the P side of the input stage from reaching the output stage if the CM voltage of the differential input voltage is substantially close to an upper voltage rail of the comparator; and
a second CM detection circuit that inhibits differential current from the N side of the input stage from reaching the output stage if the CM voltage of the differential input voltage is substantially close to a lower voltage rail of the comparator.

9. The comparator of claim 8, wherein:
the first CM detection circuit inhibits differential current from the P side of the input stage from reaching the output stage if the CM voltage of the differential input voltage is within a P-type transistor threshold voltage of the upper voltage rail; and
the second CM detection circuit inhibits differential current from the N side of the input stage from reaching the output stage if the CM voltage of the differential input voltage is within an N-type transistor threshold voltage of the lower voltage rail.

10. The comparator of claim 1, further comprising a trigger circuit connected to the output stage that changes the comparator output based on changes in current flowing through the output stage.

11. The comparator of claim 1, wherein:
the comparator operates with constant hysteresis voltage and constant transconductance over a CM operating range of the comparator;
the input stage comprises:
  a P side comprising a first super source-follower sub-circuit that is source-coupled by a first resistor to a second super source-follower sub-circuit; and
  a N side comprising a third super source-follower sub-circuit that is source-coupled by a second resistor to a fourth super source-follower sub-circuit;
the hysteresis current-injection circuitry comprises:
  a P-side hysteresis current-injection circuit connected to inject a first hysteresis current into the P side of the input stage; and
  an N-side hysteresis current-injection circuit connected to inject a second hysteresis current into the N side of the input stage;
the first and second resistors have equivalent resistance levels;
the first and second hysteresis currents have equivalent current magnitudes;
the transconductance of the input stage is based on the resistance level of the first and second resistors;
the hysteresis voltage of the comparator is based on the resistance level of the first and second resistors and the current magnitude of the hysteresis current; and
wherein the CM detection circuit comprises:
  a first CM detection circuit that inhibits differential current from the P side of the input stage from reaching the output stage if the CM voltage of the differential input voltage is within a P-type transistor threshold voltage of an upper voltage rail of the comparator;
  a second CM detection circuit that inhibits differential current from the N side of the input stage from reaching the output stage if the CM voltage of the differential input voltage is within an N-type transistor threshold voltage of a lower voltage rail of the comparator; and
  a trigger circuit connected to the output stage that changes the comparator output based on changes in current flowing through the output stage.

* * * * *